(12) United States Patent
Pellizzer et al.

(10) Patent No.: US 9,111,856 B2
(45) Date of Patent: Aug. 18, 2015

(54) METHOD FOR FABRICATING A PHASE-CHANGE MEMORY CELL

(75) Inventors: Fabio Pellizzer, Cornate d'Adda (IT);
Michele Magistretti, Gessate (IT);
Cristina Casellato, Sulbiate (IT);
Monica Vigilante, Cavenago Brianza (IT)

(73) Assignee: Micron Technology, Inc., Boise, ID (US)

( * ) Notice: Subject to any disclaimer, the term of this patent is extended or adjusted under 35 U.S.C. 154(b) by 534 days.

(21) Appl. No.: 13/132,603

(22) PCT Filed: Dec. 30, 2008

(86) PCT No.: PCT/IT2008/000815
§ 371 (c)(1),
(2), (4) Date: Jun. 2, 2011

(87) PCT Pub. No.: WO2010/076827
PCT Pub. Date: Jul. 8, 2010

(65) Prior Publication Data
US 2011/0248233 A1    Oct. 13, 2011

(51) Int. Cl.
*H01L 45/00* (2006.01)
*H01L 27/24* (2006.01)

(52) U.S. Cl.
CPC ............ *H01L 27/2445* (2013.01); *H01L 45/06* (2013.01); *H01L 45/126* (2013.01); *H01L 45/1233* (2013.01); *H01L 45/1246* (2013.01); *H01L 45/141* (2013.01); *H01L 45/144* (2013.01); *H01L 45/1608* (2013.01); *H01L 45/1675* (2013.01)

(58) Field of Classification Search
CPC ... H01L 45/1608; H01L 45/141; H01L 45/06; H01L 45/144; H01L 45/126; H01L 45/1246; H01L 45/1675
USPC ......................................... 438/95; 257/3, 4, 5
See application file for complete search history.

(56) References Cited

U.S. PATENT DOCUMENTS

| | | | |
|---|---|---|---|
| 7,348,268 B2 * | 3/2008 | Dennison ...................... | 438/597 |
| 2005/0173691 A1 * | 8/2005 | Lee et al. .......................... | 257/2 |
| 2006/0001016 A1 * | 1/2006 | Dennison ......................... | 257/2 |
| 2007/0096074 A1 * | 5/2007 | Asano et al. ..................... | 257/4 |
| 2008/0128677 A1 * | 6/2008 | Park et al. ........................ | 257/4 |
| 2008/0246016 A1 * | 10/2008 | Kakoschke et al. .............. | 257/5 |
| 2008/0304311 A1 * | 12/2008 | Philipp et al. ................. | 365/148 |
| 2009/0316473 A1 * | 12/2009 | Happ et al. .................... | 365/163 |

* cited by examiner

*Primary Examiner* — Phat X Cao
(74) *Attorney, Agent, or Firm* — Schwegman Lundberg & Woessner, P.A.

(57) ABSTRACT

A method for fabricating a phase-change memory cell is described. The method includes forming a dielectric layer (228) on a metal layer (226) above a substrate. A phase-change material layer (230) is formed on the dielectric layer. A contact region (232) is formed, within the dielectric layer, between the phase-change material layer and the metal layer by breaking-down a portion of the dielectric layer.

13 Claims, 7 Drawing Sheets

METHOD FOR FABRICATING A PHASE-CHANGE MEMORY CELL

CROSS REFERENCE TO RELATED APPLICATION

This patent application is a U.S. National Phase application under 35 U.S.C. §371 of International Application No. PCT/IT2008/000815, filed on Dec. 30, 2008, entitled METHOD FOR FABRICATING A PHASE-CHANGE MEMORY CELL.

TECHNICAL FIELD

Embodiments of the invention are in the field of phase-change memory cells and, in particular, methods for fabricating phase-change memory cells.

BACKGROUND

Embedded SRAM and DRAM have problems with non-volatility and soft error rates, while embedded FLASH memories require additional masking layers or processing steps during manufacture, require high-voltage for programming, and have issues with endurance and reliability. Phase-Change Memory (PCM) overcomes the criticality of the above mentioned parameters and exhibits favorable write speeds, small cell sizes, simpler circuitries and a fabrication compatibility with the Complementary Metal-Oxide-Semiconductor (CMOS) process. However, additional improvements are needed in the evolution of the PCM technology.

DETAILED DESCRIPTION

Figure 1:
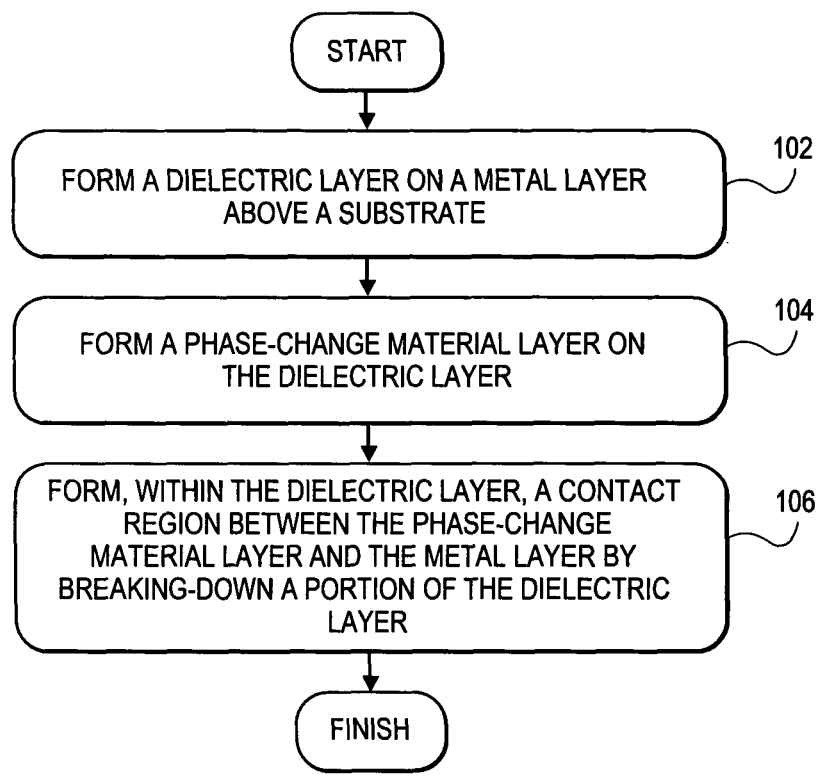
FIG. 1 illustrates a Flowchart representing operations in a method for fabricating a phase-change memory cell, in accordance with an embodiment of the present invention.

A method for fabricating a phase-change memory cell is described herein. In the following description, numerous specific details are set forth, such as specific dimensions, in order to provide a thorough understanding of embodiments of the present invention. It will be apparent to one skilled in the art that embodiments of the present invention may be practiced without these specific details. In other instances, well-known processing operations, such as lithographic and etch operations, are not described in detail in order to not unnecessarily obscure embodiments of the present invention. Furthermore, it is to be understood that the various embodiments shown in the Figures are illustrative representations and are not necessarily drawn to scale.

Disclosed herein is a method for fabricating a phase-change memory cell. A dielectric layer may be formed on a metal layer above a substrate. In an embodiment, a phase-change material layer is formed on the dielectric layer. A contact region is then formed, within the dielectric layer, between the phase-change material layer and the metal layer by breaking-down a portion of the dielectric layer. A phase-change memory cell may include a dielectric layer disposed on a metal layer disposed above a substrate. In an embodiment, a phase-change material layer is disposed on the dielectric layer. A contact region between the phase-change material layer and the metal layer is disposed within the dielectric layer, the contact region having approximately vertical sidewalls.

One issue with conventional phase-change memory cells may be the high magnitude of the programming current required to operate the cells, e.g. to transition the phase-change memory cells to an amorphous state. In a conventional phase-change memory cell architecture, the magnitude of the programming current is approximately proportional to the interface area between a phase-change material layer and an underlying heater element. In accordance with an embodiment of the present invention, the formation of a contact region upon breaking-down a portion of a dielectric layer provides an opportunity for optimal control of the quality and dimensions of the contact region. The contact region is a region where direct contact is made between a phase-change material layer and a metal layer, such as a heater. For example, in accordance with an embodiment of the present invention, a break-down process is used to form a contact region for use in a phase-change memory cell. Forming the contact region in this way may allow for control, e.g. by a heater element, of the amount of current provided to a portion of a phase-change material. Furthermore, by forming the contact region by way of a break-down process, such as a by applying a current pulse having a magnitude significantly above the set-state target current to effectively punch a hole in a dielectric layer between a phase-change material layer and metal layer, difficult processing operations may be avoided. Such operations that may be eliminated from the process include sub-lithographic trench formation and sub-lithographic alignment techniques that would otherwise be used to form a direct contact region between a phase-change material layer and a metal layer in a conventional manner.

In accordance with another embodiment of the present invention, the introduction of a so-called break-down dielectric layer (a layer that can be electrically punched-through) is used to reduce the requisite magnitude of a programming current, as compared with the programming current used in conventional phase-change memory cells. In an embodiment, a break-down dielectric layer is incorporated to confine a programming current to the region of the break-down dielectric layer that is actually broken-down. This moves the architecture, of the phase-change memory cell away from a geometrically controlled architecture to an architecture that is electrically controlled. In a specific embodiment, the programming current is reduced to approximately half of what would otherwise be required in a conventional phase-change memory cell, e.g. an approximate reduction from 600 micro- Amps to 300 micro-Amps at the 90 nanometer product node. In another embodiment, the use of a break-down dielectric layer allows for a modular simplification of the overall architecture of a phase-change memory cell, such as providing a heater-less compact structure. However, in other embodiments, a heater element is still used in conjunction with a break-down layer.

A process of forming a phase-change memory cell may include the use of a break-down dielectric layer. FIG. 1 illustrates a Flowchart 100 representing operations in a method for fabricating a phase-change memory cell, in accordance with an embodiment of the present invention.

Referring to operation 102 of Flowchart 100, a method for fabricating a phase-change memory cell includes forming a dielectric layer on a metal layer above a substrate. In accordance with an embodiment of the present invention, forming the dielectric layer on the metal layer above the substrate includes forming the dielectric layer above a heater element, as described in more detail below in association with FIGS. 2A and 2B. In one embodiment, forming the dielectric layer above the heater element includes forming the dielectric layer above a heater element having a vertical wall configuration. In another embodiment, forming the dielectric layer above the heater element includes forming the dielectric layer above a bulk heater element. In accordance with another embodiment of the present invention, forming the dielectric layer on the metal layer above the substrate includes forming the dielectric layer above a metal plug, as described in more detail below in association with FIGS. 3A and 3B. In accordance with an alternative embodiment of the present invention, the dielectric layer is formed above a bare emitter region (no silicide) or above a silicided emitter region. In an embodiment, forming the dielectric layer on the metal layer above the substrate includes forming an oxygen-free layer by a chemical vapor deposition process. An inclusion of oxygen may be detrimental because it may oxidize the heater element or it may poison a phase-change material layer, such as a chalcogenide material layer, deteriorating the retention or endurance of a phase-change memory cell. In a specific embodiment, forming the oxygen-free layer includes forming a silicon nitride layer. In a particular embodiment, forming the silicon nitride layer includes forming a silicon nitride thickness approximately in the range of 1-2 nanometers.

Referring to operation 104 of Flowchart 100, a phase-change material layer is formed on the dielectric layer. In accordance with an embodiment of the present invention, forming the phase-change material layer on the dielectric layer includes forming a chalcogenide material on the dielectric layer. In one embodiment, forming the chalcogenide material on the dielectric layer includes forming a layer of $Ge_2Sb_2Te_5$ on the dielectric layer. In a specific embodiment, forming the layer of $Ge_2Sb_2Te_5$ on the dielectric layer includes using a physical vapor deposition process and forming the phase-change material layer to a thickness approximately in the range of 30-80 nanometers. In an embodiment, the phase-change material layer is patterned to properly orient the layer relative to planned word-lines and bit-lines. In an alternative embodiment, the patterning process is skipped.

Referring to operation 106 of Flowchart 100, a contact region is formed, within the dielectric layer, between the phase-change material layer and the metal layer by breaking-down a portion of the dielectric layer. In accordance with an embodiment of the present invention, forming the contact region includes first determining a set-state target current for the phase-change material layer and then applying, through the metal layer, a current pulse greater than the set-state target current. In an embodiment, the set-state target current is the current that a phase-change memory cell will have to drive, after break-down of the dielectric layer, when the cell is in a crystalline, e.g. a highly conductive, state. In one embodiment, the set-state target current is approximately 10 micro-Amps and the current pulse greater than the set-state target current is approximately in the range of 50-100 micro-Amps. In another embodiment, applying the current pulse greater than the set-state target current includes applying a current pulse having a falling edge with a duration approximately in the range of 100-1000 nanoseconds. In a specific embodiment, subsequent to applying the current pulse, the phase-change memory cell is in a crystalline state. In another embodiment, the method further includes, subsequent to applying the current pulse greater than the set-state target current, verifying the actual current driven by the phase-change memory cell in a crystalline state. If the actual current is less than the set-state target current, a second current pulse greater than the set-state target current is applied, wherein the amplitude of the second current pulse is greater than the amplitude of the original current pulse. Subsequently, the actual current driven by the phase-change memory cell in the crystalline state is again verified. The applying and verifying is repeated until the phase-change memory cell exhibits the set-state target current. In such an algorithm, in a specific embodiment, it is important to tailor the operations from one pulse to the next in order to guarantee that the target set-state current is not exceeded by more than a desired tolerable value.

In accordance with an embodiment of the present invention, forming the contact region includes forming a region of direct contact between the phase-change material layer and the metal layer. In one embodiment, the phase-change material layer fills the region of the dielectric layer that is broken down. In an alternative embodiment, the metal layer fills the region of the dielectric layer that is broken down. In yet another alternative embodiment, both the phase-change material layer and the metal layer fill the region of the dielectric layer that is broken down. In an embodiment, forming the contact region between the phase-change material layer and the metal layer and within the dielectric layer includes forming a contact region having approximately vertical sidewalls, as described in more detail below in association with FIGS. 2B and 3B.

Figure 2A:
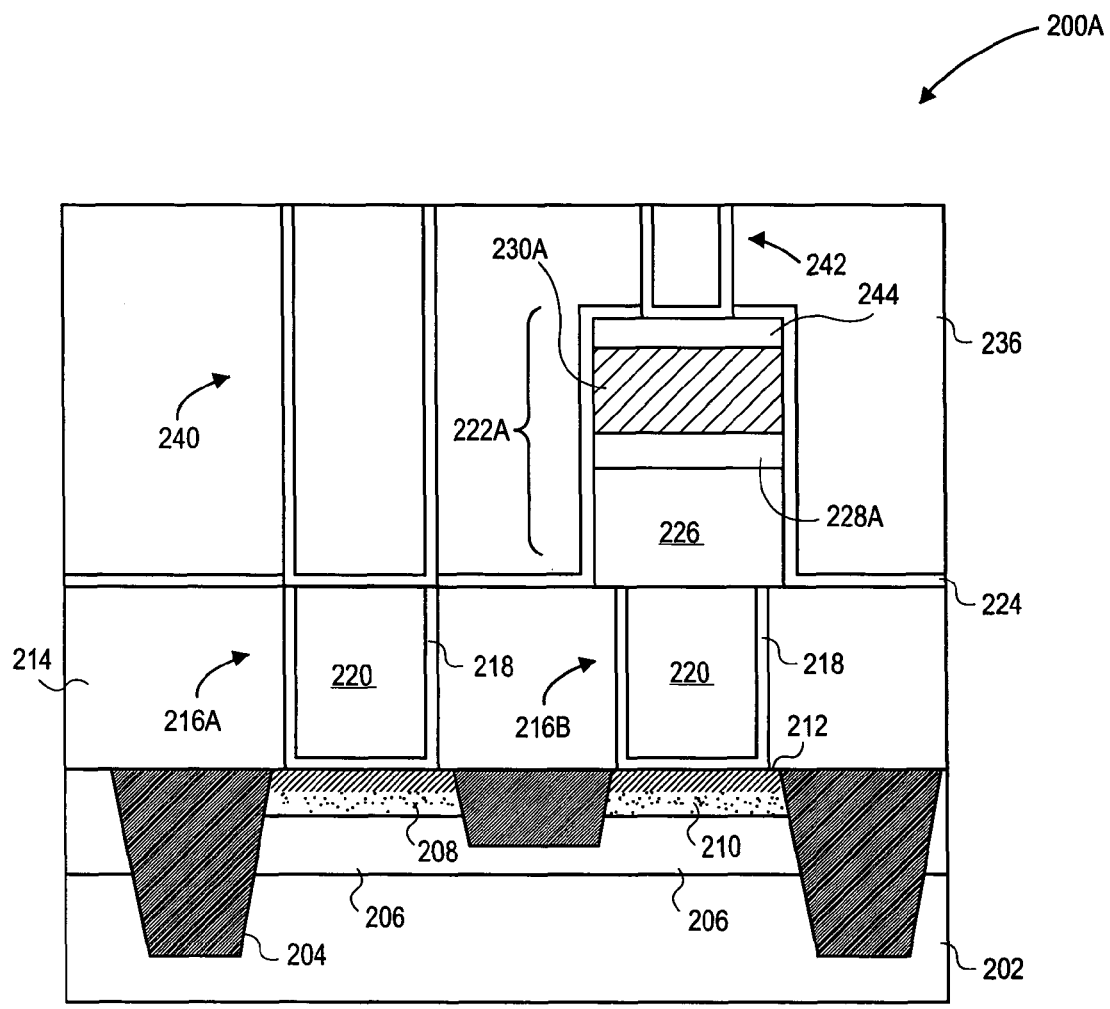
FIG. 2A illustrates a cross-sectional view of a phase-change memory cell prior to breaking-down a portion of a dielectric layer, in accordance with an embodiment of the present invention.
Figure 2B:
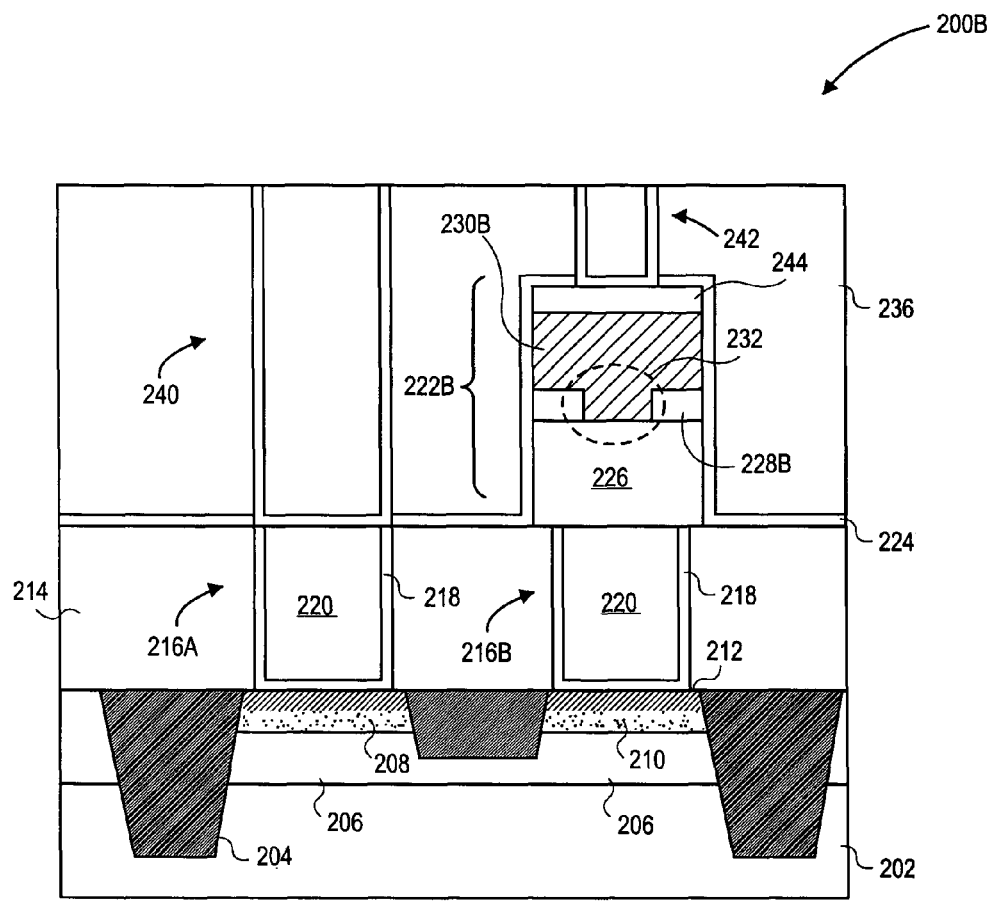
FIG. 2B illustrates a cross-sectional view of a phase-change memory cell subsequent to breaking-down a portion of a dielectric layer, in accordance with an embodiment of the present invention.

In an aspect of the present invention, a phase-change memory cell may be fabricated by electrically breaking-down a portion of a dielectric layer disposed on a heater element. FIG. 2A illustrates a cross-sectional view of a phase-change memory cell prior to breaking-down a portion of a dielectric layer, in accordance with an embodiment of the present invention. FIG. 2B illustrates a cross-sectional view of a phase-change memory cell subsequent to breaking-down a portion of a dielectric layer, in accordance with an embodiment of the present invention.

Referring to FIG. 2A, a pre-contact phase-change memory cell 200A includes a P-type substrate 202 having insulation regions 204 and a base region 206 of N-type conductivity disposed therein. Base contact region 208, of N+-type conductivity, and emitter region 210, of P+-type conductivity, are disposed in base region 206. Silicide regions 212 may also be included, as depicted in FIG. 2A. A dielectric layer 214 is disposed above substrate 202 and includes plugs 216A and 216B having a seed or barrier layer 218, e.g. a Ti/TiN layer, and filled with a fill metal 220, e.g. tungsten, to form a base contact 216A and an emitter contact 216B. Thus, in accordance with an embodiment of the present invention, base contact 216A is in direct electrical contact with base contact region 208, while emitter contact 216B is in direct electrical contact with emitter region 210. Base region 206, base contact region 208, emitter region 210 and substrate 202 (intrinsic collector) form selection transistors for pre-contact phase-change memory cell 200A. A pre-break-down storage element 222A is disposed above emitter contact 216B and is effectively sealed by a dielectric layer 224. A contact 240 is formed in a dielectric layer 236 and in the sealing dielectric layer 224, and is aligned to couple with base contact 216A, while another contact 242 is aligned to couple with emitter contact 216B via pre-break-down storage element 222A.

Referring again to FIG. 2A, in accordance with an embodiment of the present invention, pre-break-down storage element 222A includes a dielectric layer 228A disposed on a metal layer 226. A phase-change material layer 230A is disposed on dielectric layer 228A. In an embodiment, metal layer 226 is included in a heater element, as depicted in FIG. 2A. In one embodiment, the heater element includes a vertical wall configuration (not shown, however the perpendicular dimension of metal layer 226 would be thin relative to the width of metal layer 226 shown in FIG. 2A). In an alternative embodiment, the heater element includes a bulk heater element configuration (not shown, however the perpendicular dimension of metal layer 226 would be approximately the same as the width of metal layer 226 shown in FIG. 2A). In accordance with an embodiment of the present invention, phase-change material layer 230A includes a chalcogenide material. In one embodiment, the chalcogenide material includes a layer of $Ge_2Sb_2Te_5$. In an embodiment, dielectric layer 228A includes an oxygen-free layer. In an embodiment, the oxygen-free layer is a silicon nitride layer. In a particular embodiment, the silicon nitride layer has a thickness approximately in the range of 1-2 nanometers. In an embodiment, a metallic capping layer 244 is disposed between phase-change material layer 230A and contact 242, as depicted in FIG. 2A.

Referring to FIG. 2B, in accordance with an embodiment of the present invention, a post-contact phase-change memory cell 200B includes a post-break-down storage element 222B having a contact region 232 between phase-change material layer 230B and metal layer 226, and disposed within dielectric layer 228B. In an embodiment, contact region 232 is formed by first determining a set-state target current for phase-change material layer 230A and then applying, through metal layer 226, a current pulse greater than the set-state target current, as described above in association with operation 106 of Flowchart 100. In accordance with an embodiment of the present invention, contact region 232 is a region of direct contact between phase-change material layer 232B and metal layer 226. In one embodiment, phase-change material layer 230B fills the region of dielectric layer 228B that is broken down, as depicted in FIG. 2B. In an alternative embodiment, metal layer 226 fills the region of dielectric layer 228B that is broken down. In yet another alternative embodiment, both phase-change material layer 230B and metal layer 226 fill the region of dielectric layer 228B that is broken down. In an embodiment, contact region 232 between phase-change material layer 230B and metal layer 226, and within dielectric layer 228B, has approximately vertical sidewalls, as depicted in FIG. 2B. Such a profile may be in contrast to the profile of a patterned micro-trench which can have sloped sidewalls as a result of the patterning processes used to fabricate such a micro-trench. Accordingly, in an embodiment, contact region 232 having approximately vertical sidewalls is better configured to confine a programming current, particularly in situations where the programming current is confined to the region of dielectric layer 228B that is actually broken-down. In one embodiment, contact region 232 between phase-change material layer 230B and metal layer 226 has an area smaller than the surface area of the top surface of metal layer 226, as depicted in FIG. 2B. In an alternative embodiment, contact region 232 between phase-change material layer 230B and metal layer 226 has an area approximately equal to the surface area of the top surface of metal layer 226.

Figure 3A:
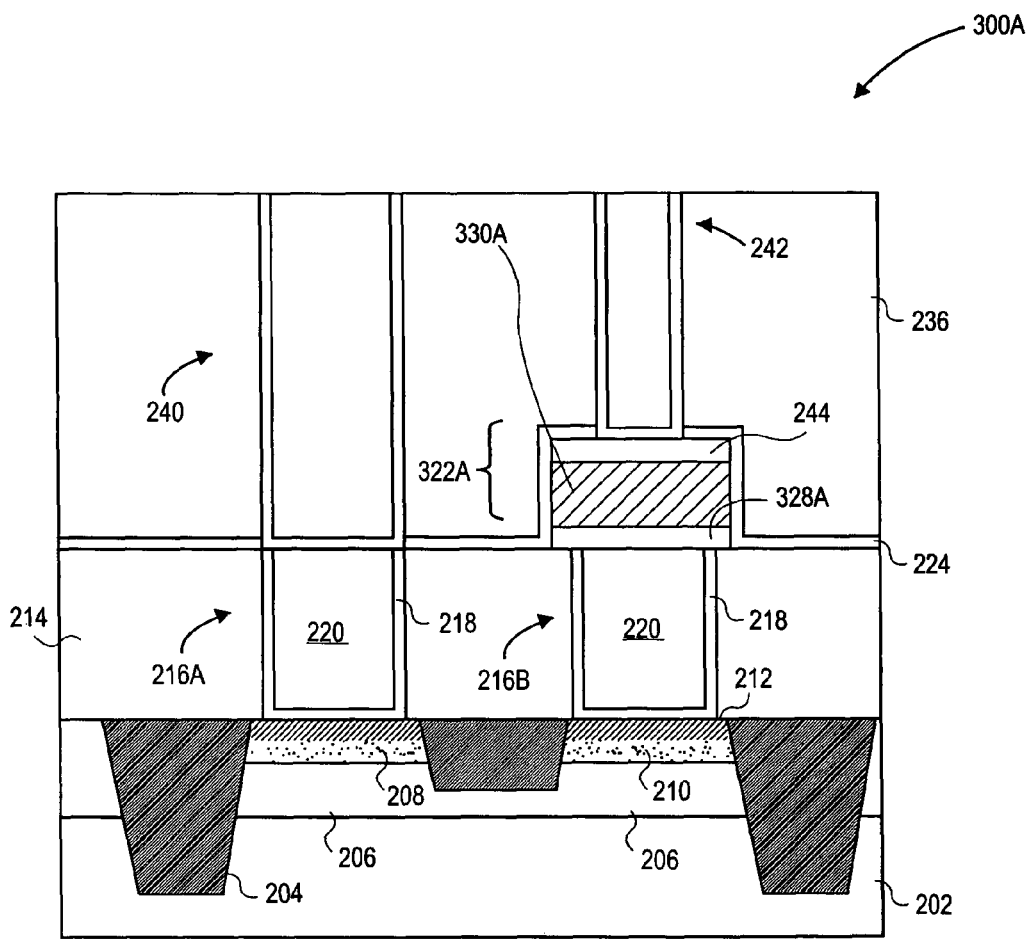
FIG. 3A illustrates a cross-sectional view of a phase-change memory cell prior to breaking-down a portion of a dielectric layer, in accordance with an embodiment of the present invention.
Figure 3B:
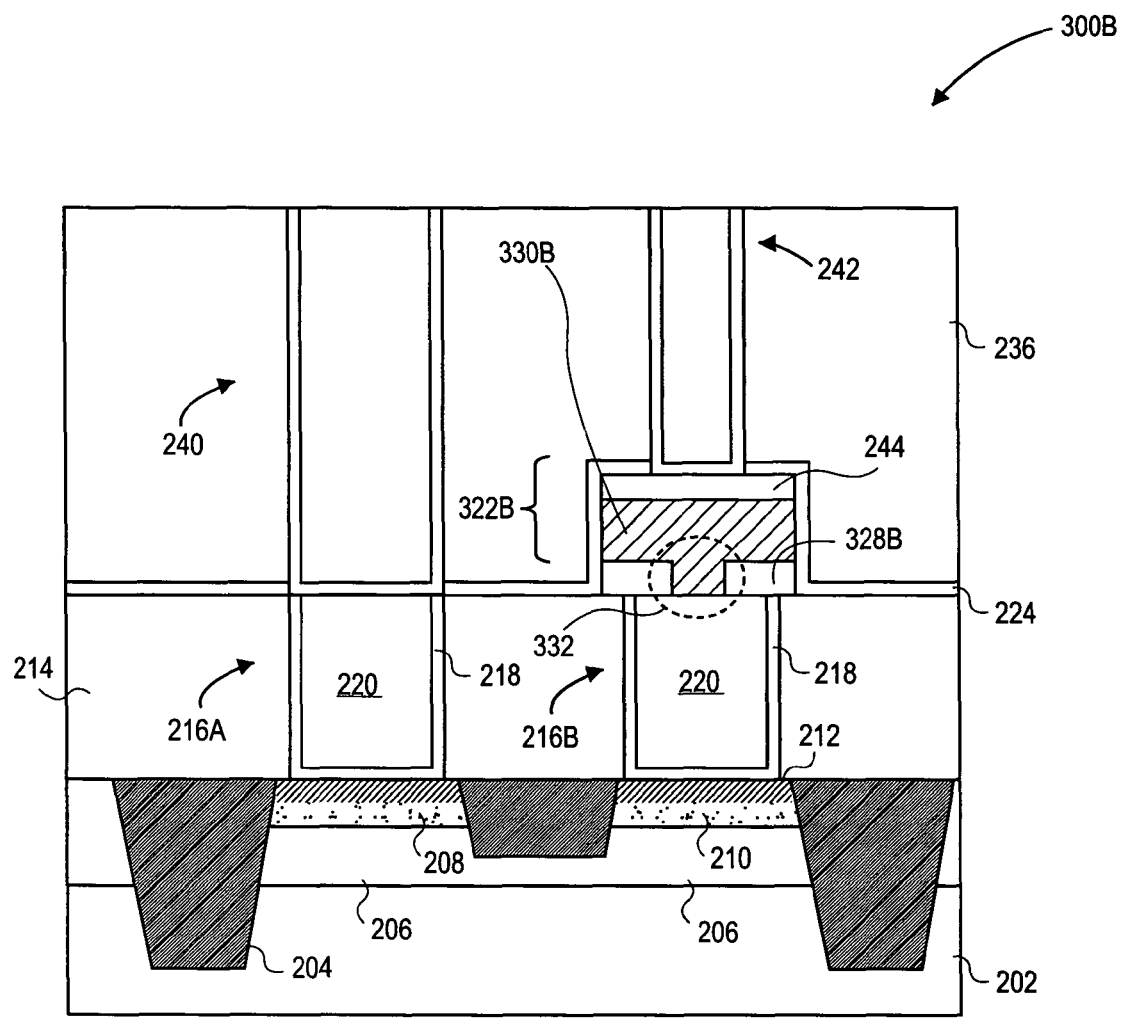
FIG. 3B illustrates a cross-sectional view of a phase-change memory cell subsequent to breaking-down a portion of a dielectric layer, in accordance with an embodiment of the present invention.

In another aspect of the present invention, a phase-change memory cell may be fabricated by electrically breaking-down a portion of a dielectric layer disposed on a metal plug. FIG. 3A illustrates a cross-sectional view of a phase-change memory cell prior to breaking-down a portion of a dielectric layer, in accordance with an embodiment of the present invention. FIG. 3B illustrates a cross-sectional view of a phase-change memory cell subsequent to breaking-down a portion of a dielectric layer, in accordance with an embodiment of the present invention.

Referring to FIG. 3A, a pre-contact phase-change memory cell 300A includes a pre-break-down storage element 322A having a dielectric layer 328A disposed on emitter contact 216B. Thus, in accordance with an embodiment of the present invention, pre-break-down storage element 322A is disposed directly above a metal plug (emitter contact 216B), as opposed to on a separate heater element having a metal layer, as described in association with FIGS. 2A and 2B. A phase-change material layer 330A is disposed on dielectric layer 328A. In an embodiment, phase-change material layer 330A includes a chalcogenide material. In one embodiment, the chalcogenide material includes a layer of $Ge_2Sb_2Te_5$. In an embodiment, dielectric layer 328A includes an oxygen-free layer. In a specific embodiment, the oxygen-free layer is a silicon nitride layer. In a particular embodiment, the silicon nitride layer has a thickness approximately in the range of 1-2 nanometers. In an embodiment, a metallic capping layer 244 is disposed between phase-change material layer 330A and contact 242, as depicted in FIG. 3A.

Referring to FIG. 3B, in accordance with an embodiment of the present invention, a post-contact phase-change memory cell 300B includes a post-break-down storage element 322B having a contact region 332 between phase-change material layer 230B and emitter contact 216B and disposed within dielectric layer 328B. In an embodiment, contact region 332 is formed by first determining a set-state target current for phase-change material layer 330A and then applying, through emitter contact 216B, a current pulse greater than the set-state target current, as described above in association with operation 106 of Flowchart 100. In accordance with an embodiment of the present invention, contact region 332 is a region of direct contact between phase-change material layer 332B and emitter contact 216B. In one embodiment, phase-change material layer 330B fills the region of dielectric layer 328B that is broken down, as depicted in FIG. 3B. In an alternative embodiment, the fill metal, e.g. tungsten, of emitter contact 216B fills the region of dielectric layer 328B that is broken down. In yet another alternative embodiment, both phase-change material layer 330B and the fill metal of emitter contact 216B fill the region of dielectric layer 328B that is broken down. In an embodiment, contact region 332 between phase-change material layer 330B and emitter contact 216B, and within dielectric layer 328B, has approximately vertical sidewalls, as depicted in FIG. 3B. Such a profile may be in contrast to the profile of a patterned micro-trench which can have sloped sidewalls as a result of the patterning processes used to fabricate such a micro-trench. Accordingly, in an embodiment, contact region 332 having approximately vertical sidewalls is better configured to confine a programming current, particularly in situations where the programming current is confined to the region of dielectric layer 328B that is actually broken-down. In one embodiment, contact region 332 between phase-change material layer 330B and emitter contact 216B has an area smaller than the surface area of the top surface of emitter contact 216B, as depicted in FIG. 3B. In an alternative embodiment, contact region 332 between phase-change material layer 330B and emitter contact 216B has an area approximately equal to the surface area of the top surface of emitter contact 216B.

In yet another aspect of the present invention, a phase-change memory cell may be fabricated by electrically breaking-down a portion of a dielectric layer disposed directly on an emitter region. Thus, in an embodiment alternative to those described in association with FIGS. 2B and 3B, a dielectric layer is broken-down by applying a current from an emitter region, where the dielectric layer is disposed directly on the emitter region. In one embodiment, the dielectric layer is disposed directly on a bare emitter region (no silicide). In another embodiment, the dielectric layer is disposed directly on a silicided emitter region. Thus, in an embodiment, a phase-change memory cell is fabricated without incorporating a heater element or a metal plug between an emitter region and a break-down dielectric layer.

Figure 4:
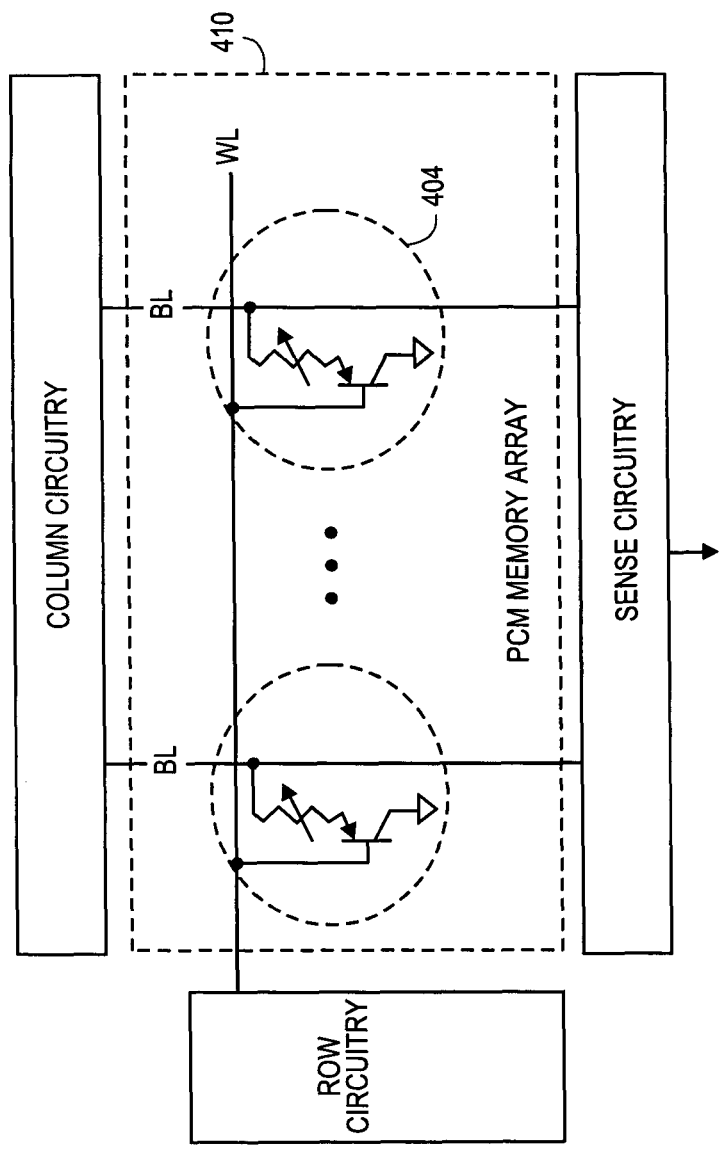
FIG. 4 illustrates an array of phase-change memory cells, in accordance with an embodiment of the present invention.

In an aspect of the present invention, a phase-change memory cell array includes memory cells that are composed of a storage material in combination with a selector device. For example, FIG. 4 illustrates an array 410 of phase-change memory cells, in accordance with an embodiment of the present invention. In an embodiment, array 410 includes phase-change memory cells composed of alloys of elements of group VI of the periodic table, elements such as Te or Se that are referred to as chalcogenides or chalcogenic materials. Chalcogenides may be used advantageously in phase change memory cells to provide data retention and remain stable even after the power is removed from the nonvolatile memory. Taking the phase change material as $Ge_2Sb_2Te_5$ for example, two phases or more are exhibited having distinct electrical characteristics useful for memory storage. Array 410 includes phase-change memory cells, each phase-change memory cell 404 having a selector device and a memory element. Although the array is illustrated with bipolar selector devices, it should be noted that alternative embodiments may use CMOS selector devices or diodes to identify and selectively change the electrical properties (e.g. resistance, capacitance, etc.) of the chalcogenide material through the application of energy such as, for example, heat, light, voltage potential, or electrical current. The chalcogenic material may be electrically switched between different states intermediate between the amorphous and the crystalline states, thereby giving rise to a multilevel storing capability. To alter the state or phase of the memory material, this embodiment illustrates a programming voltage potential that is greater than the threshold voltage of the memory select device that may be applied to the memory cell. An electrical current flows through the memory material and generates heat that changes the electrical characteristic and alters the memory state or phase of the memory material.

By way of example, heating the phase-change material $Ge_2Sb_2Te_5$ to a temperature above 630° C. in a write operation places the phase change material above its melting temperature ($T_M$). Then, a rapid cooling places the phase-change material in the amorphous state that is referred to as a reset state where stored data may have a "0" value. Taking $Ge_2Sb_2Te_5$ as an example, the time between achieving the melting temperature $T_M$ and quenching after the local heating to achieve the amorphous phase may be less than 30 nanoseconds. On the other hand, to program a memory cell from reset to set, the local temperature is raised higher than the crystallization temperature (Tx) for a time longer than 30 nanoseconds (for $Ge_2Sb_2Te_5$) to allow complete crystallization. The phase-change material in the crystalline form is referred to as a set state and stored data may have a "1" value. Thus, the cell can be programmed by setting the amplitude and pulse width of the current that will be allowed through the cell. In summary, a higher magnitude, fast pulse will amorphize the cell, whereas a moderate magnitude, longer pulse will allow the cell to crystallize. In a read operation, the bit line (BL) and word line (WL) are selected and an external current is provided to the selected memory cell. To read a chalcogenide memory device, the current difference resulting from the different device resistance is sensed. It is then determined whether data stored in the selected memory cell is a "0" or "1" based on a voltage change caused by a resistance of the phase-change material of the selected memory cell. It is to be appreciated that the association of reset and set with amorphous and crystalline states, respectively, is a convention and that at least an opposite convention may be adopted.

Figure 5:
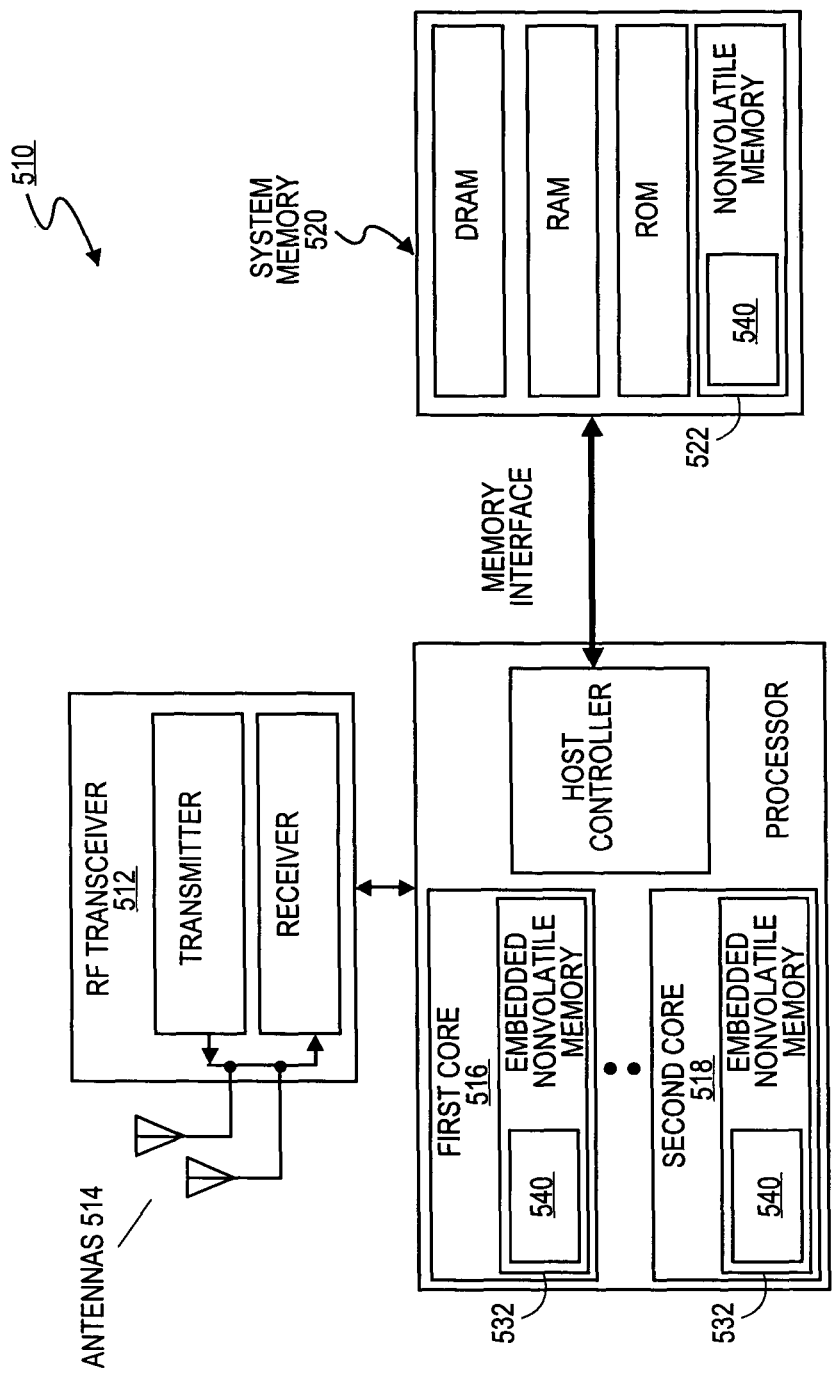
FIG. 5 illustrates a schematic representation of a wireless architecture that incorporates an array of phase-change memory cells, in accordance with an embodiment of the present invention.

In another aspect of the present invention, FIG. 5 illustrates a schematic representation of a wireless architecture that incorporates an array of phase-change memory cells, in accordance with an embodiment of the present invention. The wireless architecture embodiment illustrated in FIG. 5 shows a communications device 510. It should be noted that the present invention is not limited to wireless communication embodiments and other, non-wireless applications may be used in conjunction with embodiments of the present invention. As shown in this wireless embodiment, communications device 510 includes one or more antenna structures 514 to allow radios to communicate with other over-the-air communication devices. As such, communications device 510 may operate as a cellular device or a device that operates in wireless networks such as, for example, Wireless Fidelity (Wi-Fi) that provides the underlying technology of Wireless Local Area Network (WLAN) based on the IEEE 802.11 specifications, WiMax and Mobile WiMax based on IEEE 802.16-2005, Wideband Code Division Multiple Access (WCDMA), and Global System for Mobile Communications (GSM) networks, although the present invention is not limited to operate in only these networks. The radio subsystems co-located in the same platform of communications device 510 provide the capability of communicating with different frequency bands in an RF/location space with other devices in a network.

It should be understood that the scope of the present invention is not limited by the types of, the number of, or the frequency of the communication protocols that may be used by communications device 510. However, by way of example, the embodiment illustrates the coupling of antenna structure 514 to a transceiver 512 to accommodate modulation/demodulation. In general, analog front end transceiver 512 may be a stand-alone Radio Frequency (RF) discrete or integrated analog circuit, or transceiver 512 may be embedded with a processor having one or more processor cores 516 and 518. The multiple cores allow processing workloads to be shared across the cores and handle baseband functions and application functions. An interface may be used to provide communication or information between the processor and the memory storage in a system memory 520. Although the scope of the present invention is not limited in this respect, the interface may include serial and/or parallel buses to share information along with control signal lines to be used to provide handshaking between the processor and system memory 520.

The system memory 520 may optionally be used to store instructions that are executed by the processor during the operation of wireless communication device 510, and may be used to store user data such as the conditions for when a message is to be transmitted by wireless communication device 510 or the actual data to be transmitted. For example, the instructions stored in system memory 520 may be used to perform wireless communications, provide security functionality for communication device 510, user functionality such as calendaring, email, internet browsing, etc. System memory 520 may be provided by one or more different types of memory and may include both volatile and a nonvolatile memory 522 having a phase change material. Nonvolatile memory 522 may be referred to as a Phase Change Memory (PCM), Phase-Change Random Access Memory (PRAM or PCRAM), Ovonic Unified Memory (OUM) or Chalcogenide Random Access Memory (C-RAM). The volatile and nonvolatile memories may be combined in a stacking process to reduce the footprint on a board, packaged separately, or placed in a multi-chip package with the memory component placed on top of the processor. The embodiment also illustrates that one or more of the processor cores may be embedded with nonvolatile memory 532.

Thus, a method for method for fabricating a phase-change memory cell has been disclosed. In accordance with an embodiment of the present invention, a dielectric layer is formed on a metal layer above a substrate. A phase-change material layer is formed on the dielectric layer. A contact region is formed, within the dielectric layer, between the phase-change material layer and the metal layer by breaking-down a portion of the dielectric layer. In one embodiment, forming the contact region includes determining a set-state target current for the phase-change material layer. A current pulse greater than the set-state target current is then applied through the metal layer. In a specific embodiment, the set-state target current is approximately 10 micro-Amps and the current pulse greater than the set-state target current is approximately in the range of 50-100 micro-Amps. In another embodiment, forming the contact region between the phase-change material layer and the metal layer and within the dielectric layer includes forming a contact region having approximately vertical sidewalls.

What is claimed is:

1. A method of fabricating a phase-change memory cell, the method comprising:
    forming a dielectric layer on a metal layer above a substrate;
    forming a phase-change material layer on the dielectric layer; and
    forming, within the dielectric layer, a contact region between the phase-change material layer and the metal layer by breaking-down a portion of the dielectric layer, the forming of the contact region including
        determining a set-state target current for the phase-change material layer; and
        applying, through the metal layer, a current pulse greater than the set-state target current; and
    subsequent to applying the current pulse greater than the set-state target current, making a determination of an actual amount of current driven by the phase-change memory cell in a crystalline state; and,
    based on a determination that the actual amount of current is less than the set-state target current, applying a second current pulse greater than the set-state target current, an amplitude of the second current pulse being greater than an amplitude of the current pulse; and
    subsequent to applying the second current pulse, making another determination of the actual current driven by the phase-change memory cell in the crystalline state.

2. The method of claim 1, wherein the set-state target current is approximately 10 micro-Amps, and wherein the current pulse greater than the set-state target current is approximately in the range of 50 micro-Amps to 100 micro-Amps.

3. The method of claim 1, wherein applying the current pulse greater than the set-state target current comprises applying a current pulse having a falling edge with a duration approximately in the range of 100 nanoseconds to 1000 nanoseconds.

4. The method of claim 3, wherein, subsequent to applying the current pulse, the phase-change memory cell is in a crystalline state.

5. The method of claim 1, wherein the method further comprises repeating the applying and determining steps until the phase-change memory cell exhibits the set-state target current.

6. The method of claim 1, wherein forming the dielectric layer on the metal layer above the substrate comprises forming the dielectric layer above a heater element.

7. The method of claim 6, wherein forming the dielectric layer above the heater element comprises forming the dielectric layer above a heater element having a vertical wall configuration.

8. The method of claim 1, wherein forming the dielectric layer on the metal layer above the substrate comprises forming the dielectric layer above a metal plug.

9. The method of claim 1, wherein forming the phase-change material layer on the dielectric layer comprises forming a layer of $Ge_2Sb_2Te_5$ on the dielectric layer.

10. The method of claim 1, wherein forming the dielectric layer on the metal layer above the substrate comprises forming an oxygen-free layer by a chemical vapor deposition process.

11. The method of claim 10, wherein forming the oxygen-free layer comprises forming a silicon nitride layer by a chemical vapor deposition process.

12. The method of claim 11, wherein forming the silicon nitride layer comprises forming a silicon nitride thickness approximately in the range of 1 nanometer to 2 nanometers.

13. The method of claim 1, wherein forming the contact region between the phase-change material layer and the metal layer and within the dielectric layer comprises forming a contact region having approximately vertical sidewalls.

* * * * *